(12) United States Patent
Serre et al.

(10) Patent No.: US 8,319,339 B2
(45) Date of Patent: Nov. 27, 2012

(54) SURFACE-MOUNTED SILICON CHIP

(75) Inventors: Christophe Serre, Saint Cyr sur Loire (FR); Laurent Barreau, Cinq Mars la Pile (FR); Vincent Jarry, La Membrolle sur Choisille (FR); Patrick Hougron, Parcay Meslay (FR)

(73) Assignee: STMicroelectronics (Tours) SAS, Tours (FR)

(*) Notice: Subject to any disclaimer, the term of this patent is extended or adjusted under 35 U.S.C. 154(b) by 138 days.

(21) Appl. No.: 12/832,364

(22) Filed: Jul. 8, 2010

(65) Prior Publication Data
US 2011/0006423 A1 Jan. 13, 2011

(30) Foreign Application Priority Data

Jul. 10, 2009 (FR) ...................................... 09 54846

(51) Int. Cl.
*H01L 23/48* (2006.01)
*H01L 21/44* (2006.01)

(52) U.S. Cl. ........ 257/738; 257/734; 257/737; 257/778; 257/E21.503; 257/E21.511; 257/E21.514; 257/E23.021; 438/106; 438/108; 438/127; 525/68

(58) Field of Classification Search .................. 257/734, 257/737, 738, 778, E21.503, E21.511, E21.514, 257/E23.021; 438/106, 108, 127; 525/68
See application file for complete search history.

(56) References Cited

U.S. PATENT DOCUMENTS

| | | | |
|---|---|---|---|
| 5,075,376 A | 12/1991 | Furuta et al. | |
| 5,933,713 A * | 8/1999 | Farnworth | 438/127 |
| 6,054,222 A * | 4/2000 | Takami et al. | 428/417 |
| 6,518,090 B2 * | 2/2003 | Dotta et al. | 438/106 |
| 6,908,784 B1 * | 6/2005 | Farnworth et al. | 438/106 |
| 7,025,905 B2 * | 4/2006 | Morii et al. | 252/504 |
| 7,947,362 B2 * | 5/2011 | Hara et al. | 428/221 |
| 2001/0003049 A1 | 6/2001 | Fukasawa et al. | |
| 2004/0102029 A1 | 5/2004 | Key et al. | |
| 2004/0183215 A1 | 9/2004 | Fujieda et al. | |
| 2004/0222522 A1 | 11/2004 | Homma | |
| 2005/0167827 A1 | 8/2005 | Hayashi | |
| 2009/0054577 A1 * | 2/2009 | Uchida et al. | 524/423 |
| 2009/0326140 A1 | 12/2009 | Shimada et al. | |
| 2011/0052979 A1 * | 3/2011 | Bouillon et al. | 429/185 |
| 2011/0186993 A1 * | 8/2011 | Kobayashi et al. | 257/737 |
| 2011/0284903 A1 * | 11/2011 | Loh et al. | 257/98 |
| 2012/0085579 A1 * | 4/2012 | Tatsuzawa et al. | 174/84 R |

OTHER PUBLICATIONS

French Search Report dated Mar. 3, 2010 from corresponding French Application No. 09/54846.

* cited by examiner

*Primary Examiner* — Dao H Nguyen

(74) *Attorney, Agent, or Firm* — Wolf, Greenfield & Sacks, P.C.

(57) ABSTRACT

A silicon chip surface mounted via balls attached to its front surface, wherein the front and rear surfaces of the chip are covered with a thermosetting epoxy resin having the following characteristics: the resin contains a proportion ranging from 45 to 60% by weight of a load formed of carbon fiber particles with a maximum size of 20 μm and with its largest portion having a diameter ranging between 2 and 8 μm, on the front surface side, the loaded resin covers from 45 to 60% of the ball height, on the rear surface side, the loaded resin has a thickness ranging between 80 and 150 μm.

18 Claims, 2 Drawing Sheets

SURFACE-MOUNTED SILICON CHIP

CROSS REFERENCE TO RELATED APPLICATIONS

This application claims the priority benefit of French patent application number 09/54846, filed on Jul. 10, 2009, entitled "SURFACE-MOUNTED SILICON CHIP," which is hereby incorporated by reference to the maximum extent allowable by law.

BACKGROUND OF THE INVENTION

1. Field of the Invention

The present invention relates to the field of integrated circuits and more specifically to the protection of a semiconductor chip against shocks.

The present invention more specifically relates to surface-mounted semiconductor chips, that is, semiconductor chips having their connection pads supporting conductive protrusions intended to be directly placed against metal areas of a support such as a printed circuit board, this type of mounting being generally called a flip-chip mounting.

2. Discussion of the Related Art

In a flip-chip mounting, to reduce the bulk, bare chips having their surfaces only coated with a thin insulating layer such as a silicon oxide layer are used.

Packaged chips, which are then bulky, are also used.

FIG. 1A shows a surface-mounted chip 1 mounted on a printed circuit 3 via balls 5 attached, on the one hand, to contact pads of the chip and, on the other hand, to tracks of a printed circuit board. The chip is a bare chip which only comprises a thin layer of an insulator 7 on its front surface side (the side supporting the connection balls).

FIG. 1B is a view of the front surface of chip 1, in an example in which connection balls 5 are uniformly distributed in a matrix over the entire chip surface.

The present invention typically relates to substantially square or rectangular chips having dimensions ranging between 0.4 mm and 3 cm.

This type of mounting has been widely developed but experience has shown that it has a high risk of being defective. It has, in particular, been noted that the balls crack at their installation on the printed circuit or after mounting on the printed circuit when the device containing the printed circuit is submitted to shocks (for example, when the chip is mounted in a cell phone printed circuit and the user drops his phone on a hard surface). The ball cracking causes misconnections and an immediate failure of the circuit, or a progressive failure after some time of use.

SUMMARY OF THE INVENTION

An object of embodiments of the present invention is to protect surface-mounted chips against the consequences of shocks and more specifically against defects of the connection balls connecting the chip pads to tracks of a printed circuit.

The applicants carried out many trials and found a solution, which comprises coating the front and rear surfaces of the chip with a loaded thermosetting epoxy resin of selected composition, these layers having thicknesses selected within precise ranges.

More specifically, an embodiment of the present invention provides a silicon chip surface mounted via balls attached to its front surface, wherein the front and rear surfaces of the chip are covered with a thermosetting epoxy resin having the following characteristics:

the resin contains a proportion ranging from 45 to 60% by weight of a load formed of carbon fiber particles with a maximum size of 20 μm and with its largest portion having a diameter ranging between 2 and 8 μm, on the front surface side, the loaded resin covers from 45 to 60% of the ball height, on the rear surface side, the loaded resin has a thickness ranging between 80 and 150 μm.

According to an embodiment of the present invention, the resin has, after set-up, a Young's modulus ranging between 1 and 7 GPa.

According to an embodiment of the present invention, the balls have diameters ranging from 200 to 300 μm.

According to an embodiment of the present invention, the balls comprise a solder alloy of tin-silver-copper type, the proportion by weight of silver and copper being smaller than 10%, for example, 1% of silver and 0.5% of copper.

According to an embodiment of the present invention, the resin results from a compression molding.

The foregoing objects, features, and advantages of the present invention will be discussed in detail in the following non-limiting description of specific embodiments in connection with the accompanying drawings.

DETAILED DESCRIPTION

As usual in the representation of microelectronic components, the various drawings are not to scale and are only intended to assist with the understanding of the present invention.

Figure 2:
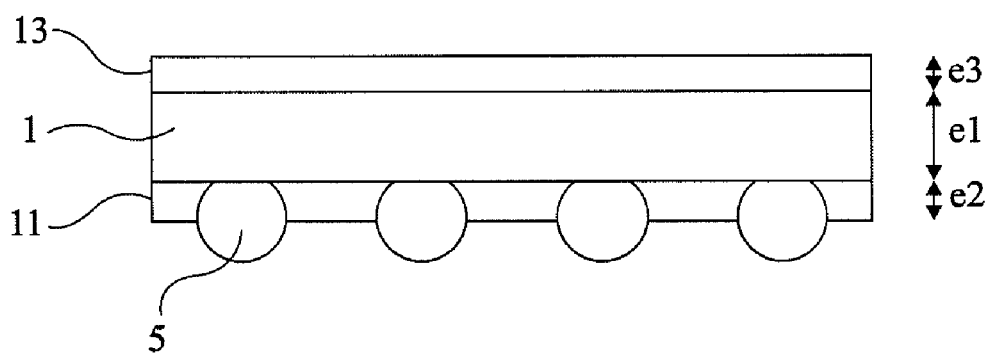
FIG. 2 shows a surface-mounted chip according to an embodiment of the present invention.

FIG. 2 shows an example of a surface-mounted chip 1. The bare silicon chip has a thickness ranging from 100 to 500 μm. A bare chip is a piece of a silicon wafer comprising regions of different levels and doping types to form selected components. This bare chip also comprises various metallization levels to ensure the connections between components and to the output pads. The bare chip is generally coated with thin insulating layers, for example, silicon oxide, in thicknesses smaller than 10 μm, currently from 1 to 3 μm. Balls 5 currently having diameters from 200 to 300 μm, which are currently made of solder alloys of tin-silver-copper type, currently designated as SAC, for Sn, Ag, Cu, are attached to this bare chip. The balls are mainly formed of tin, the proportion by weight of silver and copper being smaller than 10%, for example, 1% of silver and 0.5% of copper. The balls are soldered on the chip connection pads. Thus, if the balls have an initial diameter of 300 μm, they will then protrude from the chip surface by a height approximately ranging from 200 to 250 μm.

Figure 1A:
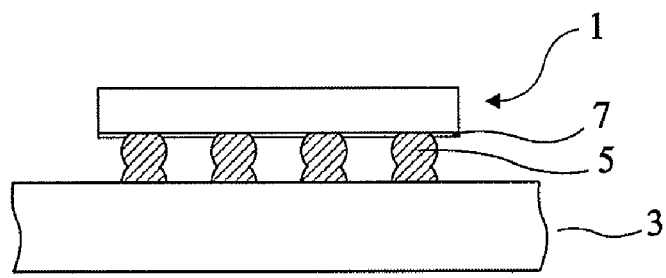
FIG. 1A is a side view of a surface-mounted chip mounted on a printed circuit board.
Figure 1B:
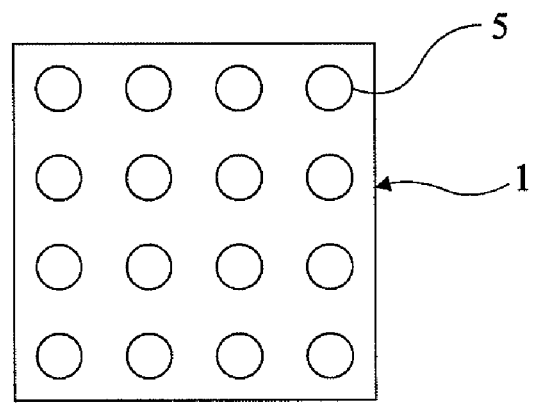
FIG. 1B is a top view of an example of a front surface of a surface-mounted chip.

The pads may be uniformly distributed as shown in the front view of FIG. 1B, or may be arranged in any other way, for example, along two parallel lines, or again by forming a frame surrounding the chip, with no central balls.

A thermosetting resin layer 11 is deposited on the front surface side of the chip to let a protrusion of each of balls 5 emerge. A thermosetting resin layer 13 is deposited on the rear surface side of chip 1.

The two thermosetting resin layers are epoxy resin layers loaded with carbon fiber bits. The carbon fiber bits have a length smaller than 20 µm and have, as a large majority, a diameter ranging between 2 and 8 µm.

Loaded epoxy resin layer 11 formed on the front surface of the chip has a thickness (e2) capable of covering from 45 to 60% of the height of the balls attached to the chip, preferably from 50 to 55%. Thus, for 300-µm balls, having a height with respect to the chip after attachment on the order of 250 µm, the resin layer will have a thickness on the order of 125 µm. Loaded epoxy resin layer 13 arranged on the rear surface of the chip is preferably formed of the same resin, loaded in the same way as resin layer 11 deposited on the front surface. As will be seen hereafter, resin layers 11 and 13 are deposited on the chips while they are still assembled in a single wafer, before dicing of this wafer. Resin layer 13 is essentially used to balance the tensile stress that may be applied to the wafer, for example after resin anneal operations, which would tend to cause a warpage of the wafer, thus adversely affecting the subsequent dicing operations. Thus, rear surface layer 13 will have a thickness (e3) on the same order of magnitude as front surface 11. Layer 13 will have a thickness greater than 50 µm and smaller than 200 µm, preferably ranging between 80 and 150 µm.

Further, the nature of the loaded thermosetting epoxy resin is selected so that, once loaded as indicated hereabove, and after setting, its Young's modulus ranges between 1 and 7 GPa.

Given the characteristics of the resin, it has appeared to be extremely difficult to form the resin layers with conventional injection molding techniques. The applicant has examined and successfully attempted to carry out a compression molding process.

Figure 3A:
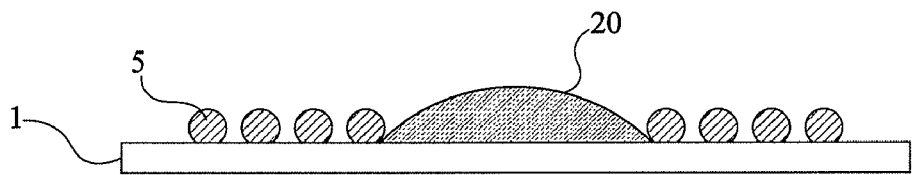
FIGS. 3A to 3C illustrate successive steps of a method according to an embodiment of the present invention for forming a resin layer on a surface-mounted chip.
Figure 3B:
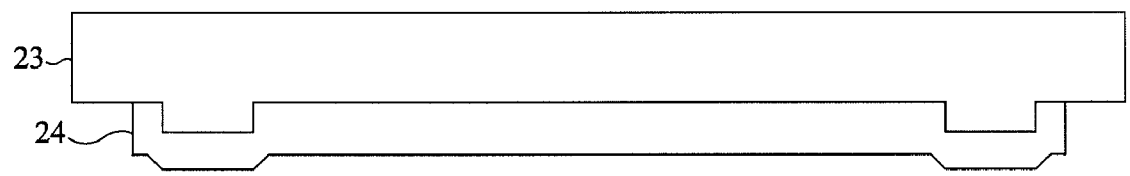
Figure 3B:
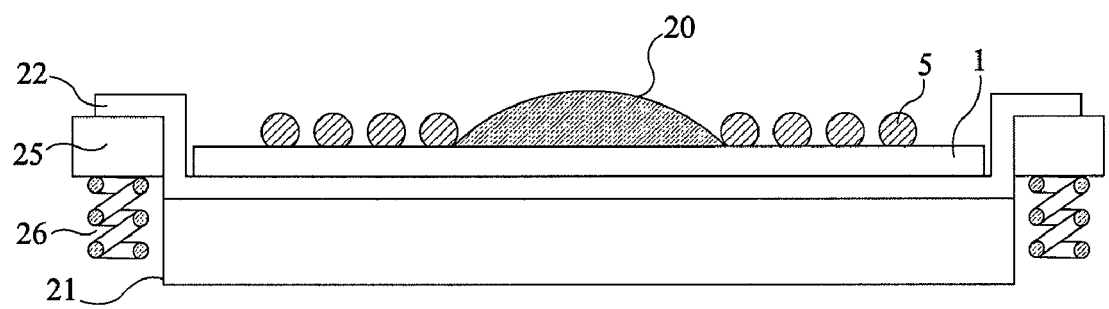
Figure 3C:
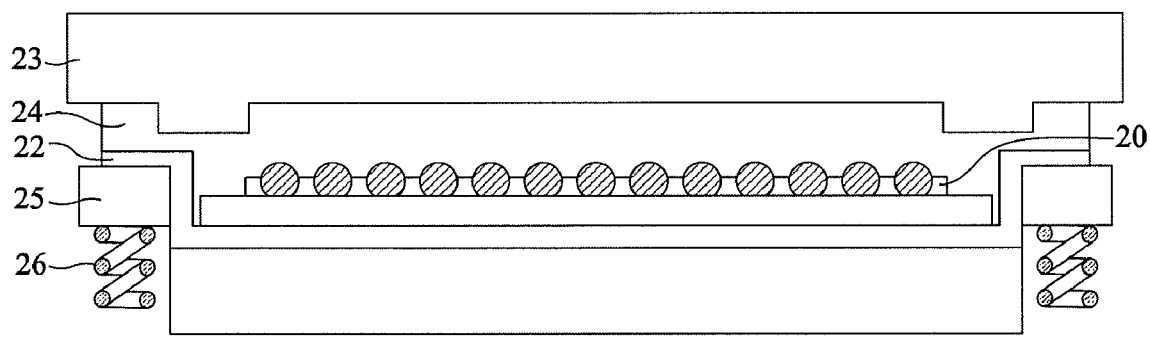

FIGS. 3A to 3C illustrate the successive steps of a recommended compression molding.

In FIG. 3A, a dose 20 of loaded epoxy resin is deposited on the front surface of a silicon wafer 1 comprising the components and provided with connection balls 5. Although only a small number of balls 5 has been shown, FIG. 3A symbolizes a silicon wafer comprising a large number of chips, each chip supporting a large number of balls. Thus, to actually have been to scale, a much larger wafer dimension should have been shown.

In FIG. 3B, wafer 1 is laid on the lower portion 21 of a mold coated with a damping film 22. Upper portion 23 of the mold coated with a damping film 24 has also be shown separately. The thickness and the flexibility of film 24 are selected so that, during the compression of the upper portion on the lower portion, this film follows the pattern formed by the upper surfaces of balls 5. Film 24 then encapsulates an upper portion of the balls.

The mold in the closed and compressed state is shown in FIG. 3C. Abutment means 25, possibly assembled on a spring 26, are provided to optimize and limit the compression. At the step shown in FIG. 3C, film 24 can be seen to surround and protect the upper portions of the balls uncovered with resin.

In this compression molding, resin dose 20 applied at the step illustrated in FIG. 3A is accurately adjusted so that, at the step of FIG. 3C, the resin is satisfactorily spread.

An advantage of this compression process is that there is no segregation of the loads (carbon fiber bits), which are regularly distributed in the spread resin.

The application of resin to the rear surface of the wafer may be performed similarly by a compression process.

The applicants have carried out impact tests on the balls with chips formed as described hereabove and with chips in which there was a protection layer of a thickness smaller than half the ball thickness, or a protection layer having a thickness on the order of half the ball thickness, but with no loaded resin.

It has then been acknowledged that while most prior devices would exhibit ball defects after a number of shocks smaller than 10, the device such as disclosed herein would only exhibit ball defects after a number of shocks greater than 30.

Specific embodiments of the present invention have been described. Various alterations, modifications, and improvements will occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A silicon chip surface mounted via balls attached to a front surface, wherein front and rear surfaces of the chip are covered with a thermosetting epoxy resin having the following characteristics:
   the resin contains a proportion ranging from 45 to 60% by weight of a load formed of carbon fiber particles with a maximum size of 20 µm and with its largest portion having a diameter ranging between 2 and 8 µm,
   on the front surface side, the loaded resin covers from 45 to 60% of the ball height,
   on the rear surface side, the loaded resin has a thickness ranging between 80 and 150 µm.

2. The silicon chip of claim 1, wherein the resin has, after setting, a Young's modulus ranging between 1 and 7 GPa.

3. The silicon chip of claim 1, wherein the balls have diameters ranging from 200 to 300 µm.

4. The silicon chip of claim 1, wherein the balls comprise a solder alloy of tin-silver-copper type, the proportion by weight of silver and copper being smaller than 10%, for example, 1% of silver and 0.5% of copper.

5. The silicon chip of claim 1, wherein the resin results from a compression molding.

6. A silicon chip surface mounted via balls attached to a front surface, wherein front and rear surfaces of the chip are covered with a thermosetting epoxy resin containing a proportion of carbon fiber particles, wherein the resin contains a proportion ranging from 45 to 60% by weight of a load formed of carbon fiber particles with a maximum size of 20 µm and with its largest portion having a diameter ranging between 2 and 8 µm.

7. The silicon chip of claim 6, wherein on the front surface side, the loaded resin covers from 45 to 60% of the ball height.

8. The silicon chip of claim 6, wherein on the rear surface side, the loaded resin has a thickness ranging between 80 and 150 µm.

9. The silicon chip of claim 6, wherein the resin has, after setting, a Young's modulus ranging between 1 and 7 GPa.

10. The silicon chip of claim 6, wherein the balls have diameters ranging from 200 to 300 µm.

11. The silicon chip of claim 6, wherein the balls comprise a solder alloy of tin-silver-copper type, the proportion by weight of silver and copper being smaller than 10%, for example, 1% of silver and 0.5% of copper.

12. The silicon chip of claim 6, wherein the resin results from a compression molding.

13. A silicon chip surface mounted via balls attached to a front surface, wherein front and rear surfaces of the chip are covered with a thermosetting epoxy resin containing a proportion of carbon fiber particles with a maximum size of 20 μm and with its largest portion having a diameter ranging between 2 and 8 μm.

14. The silicon chip of claim 13, wherein on the front surface side, the loaded resin covers from 45 to 60% of the ball height.

15. The silicon chip of claim 13, wherein on the rear surface side, the loaded resin has a thickness ranging between 80 and 150 μm.

16. The silicon chip of claim 13, wherein the balls have diameters ranging from 200 to 300 μm.

17. The silicon chip of claim 13, wherein the balls comprise a solder alloy of tin-silver-copper type, the proportion by weight of silver and copper being smaller than 10%, for example, 1% of silver and 0.5% of copper.

18. The silicon chip of claim 13, wherein the resin results from a compression molding.

* * * * *

UNITED STATES PATENT AND TRADEMARK OFFICE
CERTIFICATE OF CORRECTION

PATENT NO. : 8,319,339 B2  
APPLICATION NO. : 12/832364  
DATED : November 27, 2012  
INVENTOR(S) : Christophe Serre et al.

Page 1 of 1

It is certified that error appears in the above-identified patent and that said Letters Patent is hereby corrected as shown below:

Claim 13, col. 5, line 10 should read:
between 2 and 8 μm, wherein the resin has, after setting, a Young's modulus ranging between 1 and 7 Gpa.

Signed and Sealed this
Eighth Day of January, 2013

David J. Kappos
*Director of the United States Patent and Trademark Office*